United States Patent [19]

Mahon et al.

[11] 4,329,685

[45] May 11, 1982

[54] CONTROLLED SELECTIVE DISCONNECT SYSTEM FOR WAFER SCALE INTEGRATED CIRCUITS

[75] Inventors: Michael J. Mahon, Austin, Tex.; Roy R. Shanks, San Diego, Calif.

[73] Assignee: Burroughs Corporation, Detroit, Mich.

[21] Appl. No.: 158,052

[22] Filed: Jun. 9, 1980

[51] Int. Cl.³ .................. H04Q 9/00; G11C 17/00
[52] U.S. Cl. .................. 340/825.84; 365/96
[58] Field of Search ............ 340/166 R, 166; 365/96, 365/113, 226, 227

[56] References Cited

U.S. PATENT DOCUMENTS

| | | | |
|---|---|---|---|
| 3,691,538 | 9/1972 | Haney et al. | 340/166 R |
| 3,909,805 | 9/1975 | Touron et al. | 340/166 R |
| 3,940,740 | 2/1976 | Coontz | 340/166 R |
| 4,056,807 | 11/1977 | Thornber | 340/166 R |
| 4,151,611 | 4/1979 | Sugawara et al. | 365/227 |

*Primary Examiner*—Donald J. Yusko
*Attorney, Agent, or Firm*—Mervyn L. Young; Kevin R. Peterson

[57] ABSTRACT

This disclosure relates to a controlled selective power disconnect means for employment with the various circuits implemented on a crystalline wafer so that a particular circuit can be selectively disconnected when it has developed a defect or short or is unwanted in the system for other reasons. The disconnect means employs a gate between the power source and the circuit, which gate is controlled by a fuse that can be melted or blown by a power disconnect signal thereby opening the gate. An amorphous switch can also be used such that networks can expand or contract around defective chips as required by the particular task or tasks involved.

8 Claims, 9 Drawing Figures

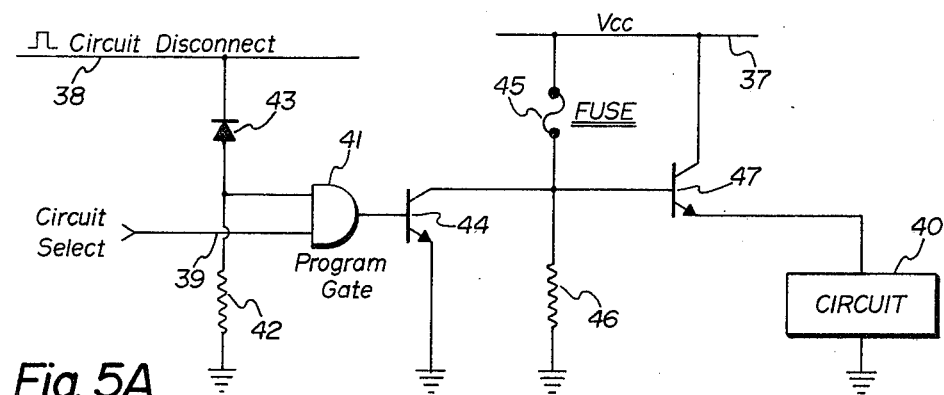
_Fig. 5A_
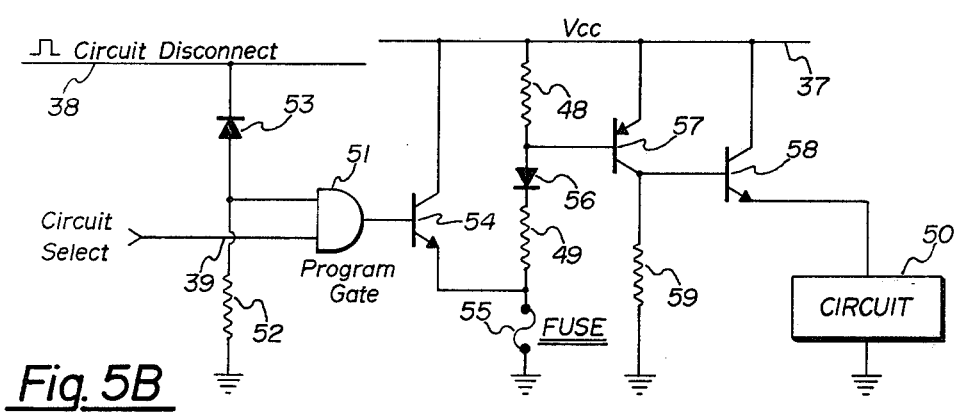
_Fig. 5B_
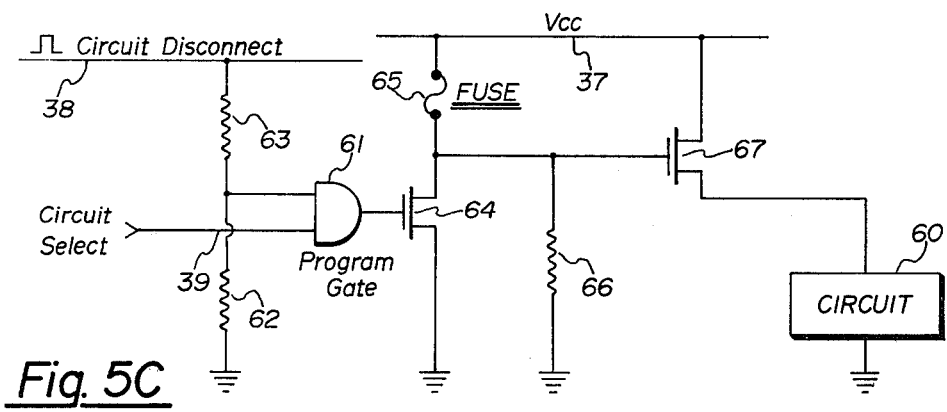
_Fig. 5C_

CONTROLLED SELECTIVE DISCONNECT SYSTEM FOR WAFER SCALE INTEGRATED CIRCUITS

BACKGROUND OF THE INVENTION

1. Field of the Invention

This invention relates to an interconnect system for wafer scale integrated circuits and more particularly to a power interconnect system employed with a network of circuits on the wafer such as processors, memories, and other devices.

2. Description of the Prior Art

Increasing attention has been given in the prior art to wafer scale integrated circuits as evidenced by the Canning et al U.S. Pat. No. 3,641,661, the Cook U.S. Pat. No. 3,810,301, and the Kilby U.S. Pat. No. 3,835,530.

Signal propagation in any circuit is limited by the velocity of electromatic waves in the conductor medium and, theoretically, by the speed of light. Switching speeds in today's integrated circuits are approaching one nanosecond, during which time the distance over which the signal propagation occurs is approximately 15 centimeters in a printed circuit board. To achieve faster switching speeds, or conversely smaller signal propagation times, it has been recognized that the interconnections between the respective circuits and components must be significantly shorter. This is achieved by wafer scale integration where a large number of discrete circuits are interconnected on a single crystalline substrate, as distinct from the current practice of forming such circuits on individual dice which are then separately packaged and mounted on a printed circuit board.

Wafer scale integration has the advantage of increased wiring densities compared to printed circuit boards as well as a reduction in the number of circuit interconnections required between the respective dice or chips and also a reduction in the number of handling and packaging steps for such chips.

A particular concern in regard to wafer scale integrated circuits is that of manufacturing yield. With today's production processes, about 30 percent of the integrated circuit dice or chips are found to be defect-free and viable. As the size of the chips increase, the probability of defects also increases, thereby reducing production yield. Thus, wafer scale integrated circuits would have to employ a large number of redundant circuits with each circuit occupying as small a proportion of the wafer as possible. After most of the fabrication steps of the wafer, but before the metallization or interconnection step, each of the individual circuits is tested to see if it is in working order and, then, only viable circuits are interconnected by specially created masks during the final metallization step. Such techniques are disclosed in Hoff, Jr. U.S. Pat. No. 4,007,452. Another approach has been to interconnect all the circuits or chips and then destroy connections to defective chips.

With the approach of wafer scale integration, it has been recognized that a number of different circuits or subsystems required for any particular system can be implemented on such an integrated circuit wafer and, in fact, a number of redundant circuits or subsystems can be implemented for later connection to create a plurality of such systems as required by the demand for such systems and the resources available. Such subsystems could be interconnected during fabrication as described above and selected or assigned to a particular system by various addressing techniques to create a parent system that could then expand or contract as required by the particular task that was being performed. For example, a tree-like network could be obtained by starting with one device which is arbitrarily designated at the top and connected to the external world. All end results are reported up the tree to the external world. Additional devices would be addressed for connection to this "parent", and in turn would have downward connections to their children.

However, it is difficult, with a rigid tree-type system, to map a problem onto the actual physical system in a manner that does not leave a large portion of the devices on one side of the physical tree in an un-utilized state. It may turn out that the parallelism is skewed and tends to push the problem onto only one side of the tree with the rest of the actual physical resources not being used. It is desirable, of course, to utilize as many resources as available as fully as possible on any given problem or task, and to have networks that can expand or contract as required.

A particular problem with a tree-type network is that if one of the devices somewhere in the tree were to fail, it cuts off communication to its children and their children and so on down the tree. it is possible that a plurality of different types of detection techniques or diagnostic means can be provided so as to determine, during the running of a particular task or problem, if in fact any particular device is unusable and to alter the network so as to maintain the network in a viable condition. However, any results that were in the system at the time of a particular device failure would be lost. Therefore, it is desirable to have a network that could be rearranged to exclude the failed device.

While communications between the various devices of the architectures described above can be initiated and terminated by various addressing techniques, there is still the problem in a wafer scale integrated circuit of disconnecting power to the failed circuits or subsystems. Although such failed circuits or devices would no longer be employed in the working network, they would still constitute a power drain as well as contribute to the heat dissipation problems associated with such a wafer scale integrated circuit.

It is, then, an object of the present invention to provide an interconnect scheme for disconnecting power leads to various devices in a wafer scale integrated circuit.

It is another object of the present invention to provide a wafer scale implemented system, the various circuits of which can be disconnected after the system has been packaged and placed in use.

It is still a further object of the present invention to provide a wafer scale implemented system in which circuits can be connected or disconnected to expand or contract the system as desired.

SUMMARY OF THE INVENTION

In order to achieve the above-identified objects, the present invention is directed to a selective power disconnect means for employment with the various circuits implemented on a crystalline wafer so that a particular circuit can be selectively disconnected when it has developed a defect or short or is unwanted in the system for other reasons. The disconnect means employs a gate between the power source and the circuit, which gate is controlled by a fuse that can be melted or blown by a power disconnect signal thereby opening the gate.

A feature, then, of the present invention resides in a selective power disconnect means for employment with a plurality of circuits implemented on a crystalline wafer substrate.

BRIEF DESCRIPTION OF THE DRAWINGS

The above and other objectives, advantages and features of the present invention will become more readily apparent from a review of the following specification when taken in conjunction with the drawings wherein:

FIGS. 5A, 5B and 5C are schematic representations of different embodiments of the present invention.

GENERAL DESCRIPTION OF THE INVENTION

The present invention is directed toward a power interconnect system for wafer scale integrated circuitry which may implement a plurality of networks of processors, memories and the like, which networks are designed to expand or contract as the various tasks of the networks require; or the present invention could be employed with such wafer scale integrated circuitry wherein a memory system is implemented on the wafer, which system is made up of a plurality of individual memory circuits such as might be found in prior art integrated dice or chips. In the latter case, access to the respective memories could be by way of a common bus distributed throughout the wafer, to which individual memory circuits are connected and accessed by appropriate addressing techniques. In the former case, a common bus could not be utilized if more than one network were to be operated at any given time. In either case, the capacity of the networks would be determined by the yield or number of viable defect-free circuits that existed in the wafer at the end of the manufacturing process. In addition, the maximum number of viable circuits available would decrease after the wafer had been packaged and placed in use in the field. Defective circuits detected at the time of fabrication would not be connected to the common power and ground supplies so as to minimize power drain and resultant heat dissipation. However, it is desirable to be able to disconnect circuits from the power and ground supplies after the wafer has been placed in service so as to maintain the wafer in operational condition for as long as possible.

To this end, the present invention is directed toward a power interconnect system for wafer scale integrated circuits where common power and ground conductors which are supplied to the viable circuits on the wafer can be subsequently disconnected. At relatively high current levels, a faulty or defective circuit would not necessarily draw more current than a viable circuit would draw. Thus, while the above-identified Hoff, Jr. U.S. Pat. No. 4,007,452 discloses the employment of "discretionary" switches with wafer scale circuitry to connect circuits to a power line after they have been tested and found to be defect-free, such switches could not simply be replaced by well known fuses to accomplish the objects of the present invention.

Figure 1:
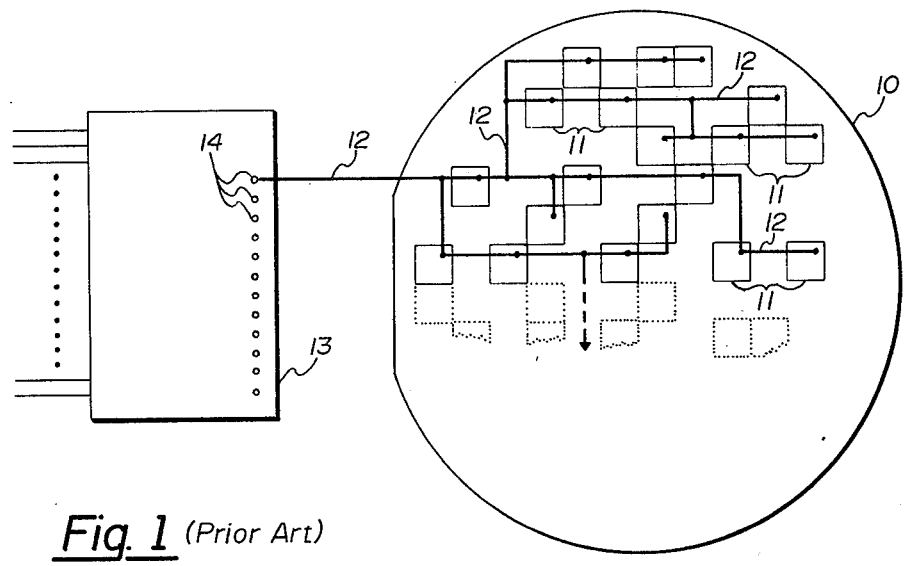
FIG. 1 is a plan view of a prior art wafer that might employ the present invention.

A typical wafer of the type that might be employed in the prior art and also with the present invention is illustrated in FIG. 1. Wafer 10 is fabricated with a number of non-defective circuits 11 as well as a number of defective circuits (not shown). Circuits 11 are connected by way of buses 12 during metallization by one of a variety of different means. Respective buses 12 are then connected to driver circuits implemented in package 13. Alternatively, all circuits can be interconnected at fabrication and by selective addressing defective circuits can be ignored. However, in the latter case, it is then required that the power connections be disconnected. Even in the former case it is desirable to be able to disconnect circuits that fail once the wafer has been placed in service.

Figure 2:
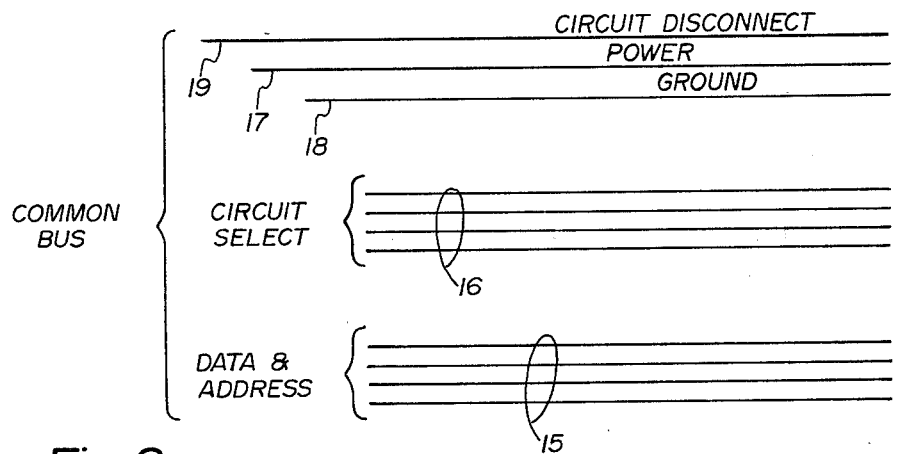
FIG. 2 is a schematic of representation of a communication and power bus that might be employed with the present invention.

A typical bus 12 of FIG. 1 is illustrated in FIG. 2 and includes data and address lines 15 and also circuit select lines 16 as well as power line 17 and ground line 18. In addition, bus 12 in the present invention includes circuit disconnect line 19, which is employed to disconnect a selected circuit or die in a manner that will be more thoroughly described below.

Figure 3B:
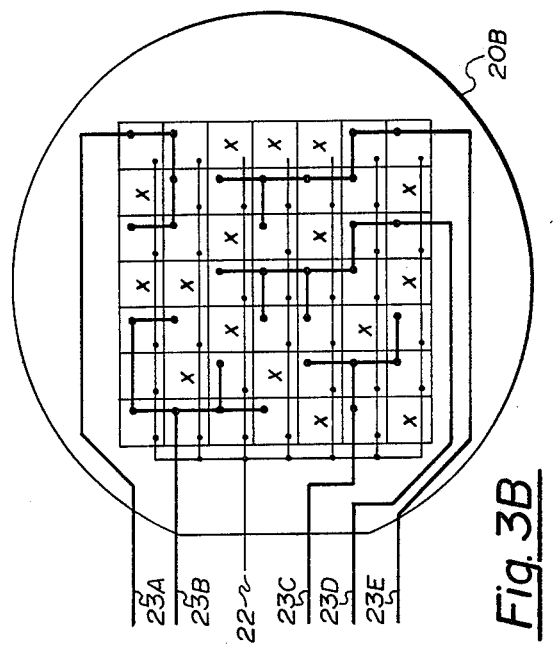
FIGS. 3A and 3B are representations of different systems embodying the present invention.
Figure 3A:
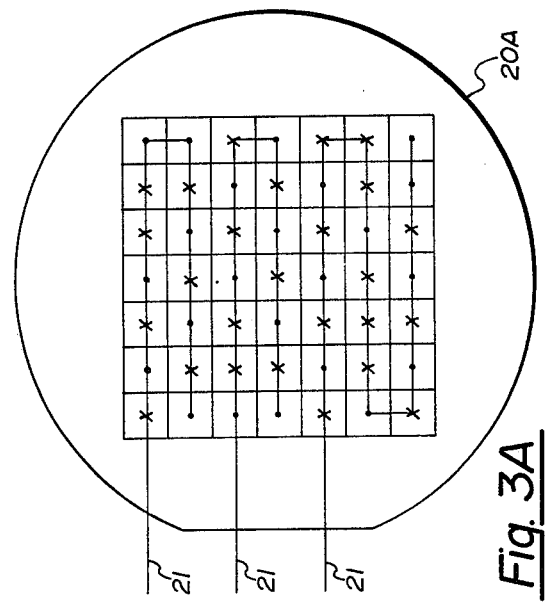

In the situation where the wafer implements a memory system, where all or at least a substantial portion of the circuits are similar, access to the respective memory circuits would be by way of one or more of common buses 21, such as illustrated in FIG. 3A. The circuits or dice which are defective are denoted by X's and either never were connected to the respective buses or were later disconnected as by the present invention. In the situation of the embodiment of FIG. 3A, the access bus would be of the type described above in relation to FIG. 2.

In the embodiment illustrated in FIG. 3A where different types of circuits such as processors, memories and the like are provided in groups associated with separate buses 21 to provide a plurality of separate systems, there can be a redundancy in the number of different circuits so that a failure of one of the circuits would not render the system inoperable. If a given circuit were to fail during operation of the wafer, the capability of the corresponding system would be reduced but it would still be able to function.

Another embodiment of the present invention is illustrated in FIG. 3B. In this embodiment, common buses are not employed and communication between the respective circuits is by way of connections between each circuit and its neighbors. In this embodiment, the circuits would be a number of processors and/or memories and the like, with each circuit being accessed by way of separate buses 35 from each of its neighbors so that individual systems could be initiated, which systems could expand or contract depending upon the tasks involved and the resources available. As each system expanded or contracted, it would have to expand around defective circuits which are illustrated in FIG. 3B by X's. Such individual systems are indicated in FIG. 3B as 23A–E. Since common buses are not employed, the bus arrangement between circuits would differ from that illustrated in FIG. 2. However, each circuit would be supplied with power from a separate arrangement of power and ground conductors 22 which include the circuit disconnect line.

DETAILED DESCRIPTION OF THE INVENTION

Figure 4A:
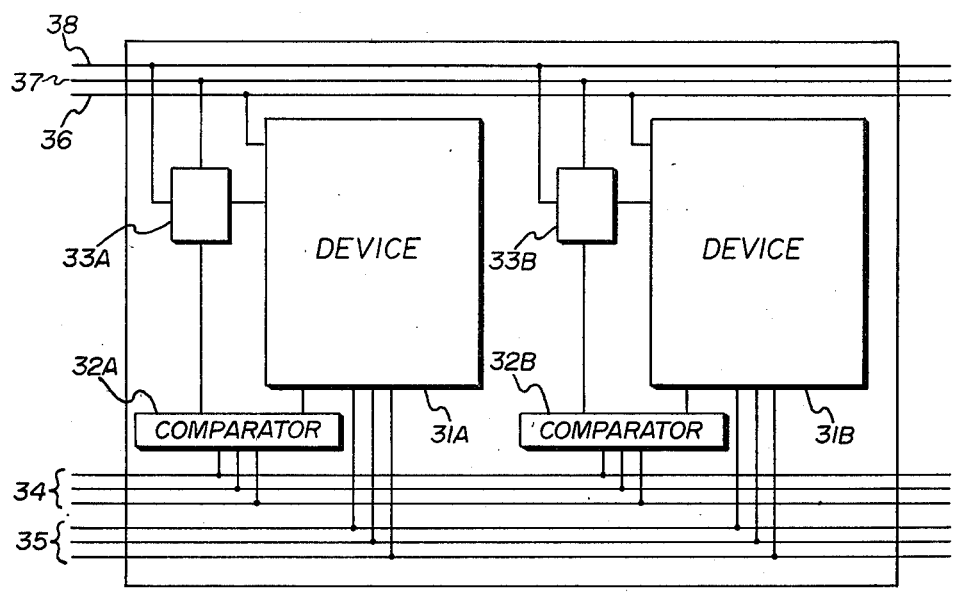
FIGS. 4A and 4B are schematic representations of circuits employing the present invention.

One embodiment of the present invention is illustrated in FIG. 4A. As shown therein, two circuit devices 31A and B are adjacent to one another on the wafer circuit and accessed by circuit select lines 34 and data and address lines 35. Also common to the respective devices is ground line 36, power line 37, and circuit disconnect line 38. Each of the devices 31A and B are directly connected to ground line 36. However, each device is coupled to power line 37 and circuit disconnect line 38 by way of power disconnect circuits 33A and B respectively. Also coupled to power disconnect circuits 33A and B are address comparators 32A and B which are connected to circuit select lines 34 to determine when that particular circuit has been selected for activation. For example, comparator 32A detects a comparison between the circuit address on circuit select lines 34 and transmits a signal to power disconnect circuit 33A. If, during this time, a disconnect signal is transmitted over circuit disconnect line 38, a fuse in power disconnect circuit 33A will be destroyed, thereby cutting off power to the respective device.

Figure 4B:
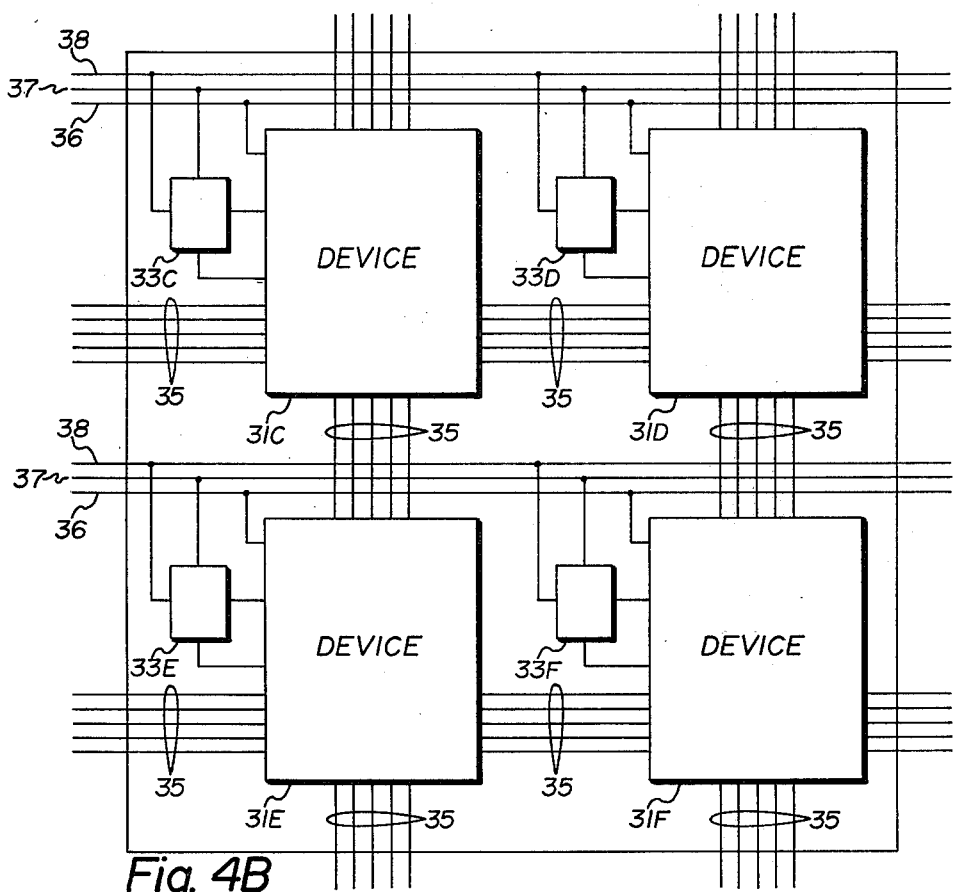

The arrangement illustrated in FIG. 4A is adapted primarily for memory arrays which could be accessed by a common bus. Such an arrangement could also be applied to a limited number of processors and other devices with interleaved communication over the respective address and data lines 35. However, for a larger array of processors such as contemplated by one embodiment of the present invention, communications between the respective devices would be from device to device such as illustrated in FIG. 4B. In this embodiment, a particular device can be activated by reception of transmission from its neighbor in concurrence with a signal on the circuit disconnect line 35 which is supplied in parallel with the power and ground lines 37 and 36 respectively to all the devices of the system. In another embodiment, the circuit disconnect signal can be in the form of two signals on orthogonal lines which are ANDed together to select the particular device circuit for disconnection. In this latter embodiment, the orthogonal circuit disconnect signals would be supplied by address registers on the edge of the wafer which would be accessed in response to diagnostic tools after it had been determined by appropriate diagnostic routines that the particular device was in fact faulty or defective.

Different embodiments of the power disconnect circuit of FIGS. 4A and B are illustrated in FIGS. 5A, B and C. Each of the circuits employs a fuse which can be destroyed selectively by methods described above. The fuse itself is generally incapable of supplying the total supply current required by the circuit. Therefore, the fuse is used to control a gate which can handle the relatively large supply current required by the circuit. The fuse is only required to supply a base current to a gate plus a small pull-down current. In this manner, the power disconnect circuit is capable of handling larger supply currents without imposing a large current requirement on the fuse.

In FIG. 5A, the circuit or device 40 which is controlled by the present invention is coupled between power line 37 and ground by way of transistor 47, the base of which is supplied a base current by way of fuse 45 to maintain transistor 47 in a conducting condition. Upon determination that circuit 40 is defective or faulty, a circuit disconnect signal is supplied to circuit disconnect line 38 and by way of diode 43 to AND gate 41 in concurrence with a circuit select signal applied to circuit select line 39, the circuit select signal being generated by comparator 32 of FIG. 4A. The resultant output signal from AND gate 41 puts transistor 44 in a conducting condition, thereby bypassing resistor 46 to ground and causing a sufficiently large current to destroy fuse 45. As a result, transistor 47 is placed in a non-conducting condition disconnecting circuit 40.

The power disconnect circuit of FIG. 5B is similar to that of FIG. 5A except that it is capable of handling larger power supply current than circuit 50. The circuit of FIG. 5C is similar to FIG. 5A except that it employs MOS transistors instead of bipolar transistors.

The respective fuses described above could be of a type such as Nichrome where the link is destroyed to open the circuit or it could be one which utilizes a phase transition with associated large resistance changes such as an amorphous switch of the type disclosed in the Bluhm U.S. Pat. No. 4,115,872 and the Holmberg U.S. Pat. No. 4,117,475. With such an amorphous type switch, the respective circuits on the wafer could be selectively disconnected or connected as desired so as to provide the capability of isolating even non-defective circuits during certain periods of time. With the destructive fuse type of embodiments, all the circuits could be connected to the power line at time of manufacture thus reducing manufacturing steps and then the individual circuits could be selectively disconnected either after the respective circuits have been tested or after the wafer had been packaged and placed in use and incurred a subsequent failure.

EPILOGUE

A wafer scale interconnect system has been disclosed above by which selected circuits such as defective circuits on the wafer can be disconnected from the power and ground lines supplied to each of the circuits. Such disconnection can be achieved at the time the wafer is fabricated and packaged or such disconnection can be made after the packaged wafer has been placed in use and incurs a subsequent defective circuit. Furthermore, in one embodiment, the respective circuits on the wafer can be disconnected and subsequently connected in a selective manner to the respective power and ground lines.

While but a few embodiments of the present invention have been described above, it will be apparent to one skilled in the art that variations and modifications can be made therein without departing from the spirit and scope of the invention as claimed.

What is claimed is:

1. An integrated circuit structure comprising:
   a crystalline substrate having a plurality of circuits formed on the surface thereof;
   power supply conductors provided for connection to each of said circuits; and
   a circuit disconnect conductor provided to supply a power disconnect signal to each of said circuits;
   each of said circuits including a power disconnect circuit having a gate coupled between one of said power supply conductors and said each circuit, said gate being coupled to said circuit disconnect conductor by a switch characterized by a phase transition with an associated large resistance change upon receipt of a circuit disconnect signal on said circuit disconnect conductor.

2. An integrated circuit structure according to claim 1 further including:
   addressing means coupled to each of said circuits to select one of said circuits for activation;
   said power disconnect means being responsive to said addressing means to disconnect one of said power supply conductors upon concurrence of a power disconnect signal and activation of said circuit.

3. An integrated circuit structure according to claim 1 further including:
   a plurality of second circuit disconnect conductors, one for each of said circuits and coupled to the respective power disconnect circuit, such that power disconnect of the circuit is dependent upon concurrence of power disconnect signals on each of said power disconnect conductors.

4. An integrated circuit structure according to claim 1 wherein:
   said switch is a fuse which is capable of being destroyed by application of a current thereto.

5. An integrated circuit structure according to claim 1 wherein:
   said switch is an amorphous switch capable of being switched from one resistance state to another resistance state.

6. An integrated circuit structure comprising:
   a crystalline substrate having a plurality of circuits formed on the surface thereof;
   power supply conductors provided for connection to each of said circuits; and
   a circuit disconnect conductor provided to supply a power disconnect signal to each of said circuits;
   each of said circuits including a power disconnect circuit including a gate coupled between said power supply conductors and said circuit, said gate being coupled to said circuit disconnect conductor for activation of said gate upon receipt of a circuit disconnect signal on said circuit disconnect conductor, said power disconnect circuit further including a switch coupled between said gate and said circuit disconnect conductor, said switch being characterized by a phase transition with an associated large resistance change.

7. An integrated circuit structure according to claim 6 wherein:
   said switch is a fuse which is capable of being destroyed by application of a current thereto.

8. An integrated circuit structure according to claim 6 wherein:
   said switch is an amorphous switch capable of being switched from one resistance state to another resistance state.

* * * * *